United States Patent
Trudel et al.

(10) Patent No.: US 10,742,029 B2
(45) Date of Patent: Aug. 11, 2020

(54) POWER CONTROL DEVICE

(71) Applicant: BIPCO-SOFT R3 INC., Warrens (BB)

(72) Inventors: Gilles Trudel, Anjou (CA); Simon Jasmin, Montreal (CA); Irene Normandin, Sherbrooke (CA)

(73) Assignee: BIPCO-Soft R3 Inc., St. Michael (BB)

( * ) Notice: Subject to any disclaimer, the term of this patent is extended or adjusted under 35 U.S.C. 154(b) by 94 days.

(21) Appl. No.: 15/385,474

(22) Filed: Dec. 20, 2016

(65) Prior Publication Data

US 2017/0126007 A1    May 4, 2017

Related U.S. Application Data

(60) Provisional application No. 13/682,824, filed on Nov. 21, 2012.

(30) Foreign Application Priority Data

Jun. 1, 2012  (CA) .................................... 2778345

(51) Int. Cl.
*H02J 3/14*    (2006.01)
*H02J 13/00*   (2006.01)
(Continued)

(52) U.S. Cl.
CPC ............... *H02J 3/14* (2013.01); *G01R 31/42* (2013.01); *G05F 1/70* (2013.01); *H02J 3/00* (2013.01);
(Continued)

(58) Field of Classification Search
CPC . G05F 1/70; H02J 13/0006; H02J 3/00; H02J 3/14; Y02B 70/3225; Y04S 20/222; Y04S 20/224; Y10T 307/406
See application file for complete search history.

(56) References Cited

U.S. PATENT DOCUMENTS 4,130,874 A   12/1978  Pai
4,215,394 A    7/1980  Galloway et al.
(Continued)

FOREIGN PATENT DOCUMENTS

CA    2520765 A1   12/2004
CA    2791889 A1   12/2004
(Continued)

OTHER PUBLICATIONS

Jul. 9, 2013—(CA) Examiner's Report—Appln 2809896.
(Continued)

*Primary Examiner* — Rexford N Barnie
*Assistant Examiner* — Elim Ortiz
(74) *Attorney, Agent, or Firm* — Banner & Witcoff, Ltd.

(57) ABSTRACT

A power control device for regulating the power that a load consumes on the basis of the AC supply frequency. The system includes decision logic that responds to a frequency deviation to implement a power regulation strategy. The power regulation strategy includes a power compensation phase during which the electrical power that the load consumes is adjusted (reduced or increased) to balance the load on the grid. The power regulation strategy also includes a power restoration phase during which the power to the load is restored (either increased or decreased). The rate at which the power is adjusted during the power compensation phase is higher than the rate at which the power is restored during the power restoration phase.

10 Claims, 8 Drawing Sheets

(51) Int. Cl.
*G01R 31/42* (2006.01)
*H02J 3/12* (2006.01)
*G05F 1/70* (2006.01)
*H02J 3/00* (2006.01)

(52) U.S. Cl.
CPC ............ *H02J 3/12* (2013.01); *H02J 13/0006* (2013.01); *H02J 2310/14* (2020.01); *Y02B 70/3225* (2013.01); *Y02B 70/3266* (2013.01); *Y04S 20/222* (2013.01); *Y04S 20/224* (2013.01); *Y04S 20/242* (2013.01); *Y10T 307/406* (2015.04); *Y10T 307/852* (2015.04)

(56) References Cited

U.S. PATENT DOCUMENTS

| | | | |
|---|---|---|---|
| 4,308,465 | A | 12/1981 | Lafuze |
| 4,317,049 | A | 2/1982 | Schweppe |
| 4,359,644 | A | 11/1982 | Foord |
| 4,409,491 | A | 10/1983 | Schott |
| 4,419,665 | A | 12/1983 | Gurr et al. |
| 4,471,232 | A | 9/1984 | Peddie et al. |
| 4,626,698 | A | 12/1986 | Harnden, Jr. et al. |
| 4,674,031 | A | 6/1987 | Siska, Jr. |
| 4,847,781 | A | 7/1989 | Brown, III et al. |
| 5,191,520 | A | 3/1993 | Eckersley |
| 5,424,903 | A | 6/1995 | Schreiber |
| 5,442,335 | A | 8/1995 | Cantin et al. |
| 6,489,834 | B2 | 12/2002 | Naffziger et al. |
| 6,490,448 | B1 | 12/2002 | Hogberg et al. |
| 6,633,823 | B2 | 10/2003 | Bartone et al. |
| 7,010,363 | B2 * | 3/2006 | Donnelly .................. H02J 3/14 137/387 |
| 7,149,605 | B2 | 12/2006 | Chassin et al. |
| 7,420,293 | B2 | 9/2008 | Donnelly et al. |
| 7,464,551 | B2 | 12/2008 | Althaus et al. |
| 7,595,613 | B2 | 9/2009 | Thompson et al. |
| 7,702,424 | B2 | 4/2010 | Cannon et al. |
| 7,830,037 | B2 | 11/2010 | Hirst |
| 7,925,597 | B2 | 4/2011 | Takano et al. |
| 8,073,573 | B2 | 12/2011 | Chassin et al. |
| 8,183,826 | B2 | 5/2012 | Tuffner et al. |
| 8,204,632 | B2 | 6/2012 | Abi-Samra |
| 8,319,599 | B2 | 11/2012 | Aisa et al. |
| 8,396,607 | B2 | 3/2013 | Hirst |
| 8,478,452 | B2 | 7/2013 | Pratt et al. |
| 8,558,511 | B2 | 10/2013 | Hammerstrom |
| 8,590,802 | B2 | 11/2013 | Hammerstrom |
| 8,600,573 | B2 | 12/2013 | Black et al. |
| 8,700,225 | B2 | 4/2014 | Pratt et al. |
| 2003/0230935 | A1 | 12/2003 | Radley |
| 2007/0198133 | A1 | 8/2007 | Hirst |
| 2007/0213880 | A1 * | 9/2007 | Ehlers ........................ H02J 3/14 700/295 |
| 2007/0222294 | A1 | 9/2007 | Tsukida et al. |
| 2009/0319415 | A1 | 12/2009 | Stoilov et al. |
| 2010/0070103 | A1 | 3/2010 | Fleck et al. |
| 2010/0141463 | A1 | 6/2010 | Schweitzer, III |
| 2010/0218006 | A1 | 8/2010 | Boss et al. |
| 2010/0219808 | A1 | 9/2010 | Steckley et al. |
| 2010/0244563 | A1 | 9/2010 | Fleck |
| 2010/0292855 | A1 | 11/2010 | Kintner-Meyer |
| 2011/0147360 | A1 | 6/2011 | Hammerstrom |
| 2011/0270452 | A1 | 11/2011 | Lu et al. |
| 2012/0200160 | A1 | 8/2012 | Pratt et al. |
| 2013/0015663 | A1 | 1/2013 | Kumula et al. |
| 2013/0268132 | A1 | 10/2013 | Pratt et al. |
| 2013/0274945 | A1 * | 10/2013 | Ganu ........................ H02J 3/14 700/296 |
| 2013/0282181 | A1 | 10/2013 | Lu et al. |
| 2014/0037275 | A1 | 2/2014 | Flohr |

FOREIGN PATENT DOCUMENTS

| | | |
|---|---|---|
| DE | 4020294 A1 | 1/1992 |
| GB | 2361118 A | 10/2001 |
| GB | 2407440 A | 4/2005 |
| GB | 2426878 A | 12/2006 |
| JP | 2002300725 A | 10/2002 |
| WO | 9406191 A1 | 3/1994 |
| WO | 9726696 A1 | 7/1997 |
| WO | 2005029670 A1 | 3/2005 |
| WO | 2013010266 A1 | 1/2013 |

OTHER PUBLICATIONS

Dec. 4, 2013—(CA) Examiner's Report—Appln 2809896.
Oct. 3, 2012—(CA) Examiner Report—Appln 2778345.
Open Energi, "CERT Final Report", May 2, 2012, 67 pages.
US Department of Energy, "Benefits of Demand Response in Electricity Markets and Recommendations for Achieving Them. A Report to Congress Pursuant to Section 1252 of the Energy Policy Act of 2005"; Feb. 2006, 122 pages.
Agyeman, Constance et al., "Dynamic Demand Challenge", Centre for Challenge Prizes, Jun. 2014, 32 pages.
Sep. 19, 2013—(PCT) International Search Report—Appln PCT/CA2013/000538.
Sep. 9, 2013—(PCT) Written Opinion of the International Searching Authority—Appln PCT/CA2013/000538.
DJ Hammerstrorn et al., Pacific Northwest National Laboratory, "Pacific Nortwest GridWise™ Testbed Demonstration Projects. Part II. Grid Friendly™ Appliance Project", Prepared for the U.S. Department of Energy under Contract DE-AC05-76RL01830, Oct. 2007, 123 pages.
Powercentsdc, "PowerCentsDC™ Program. Interim Report", Nov. 2009, 52 pages.
Feb. 17, 2015—(CA) Examiner's Report—Appln 2809896.
Aug. 25, 2014—(CA) Examiner Report—Appln 2856433.
Aisa, Valerio, technology, "Introduction to wrap technology, a very low cost communication technology for connecting household appliances at zero cost", http://www.slideshare.net/vaisa1/introduction-to-wrap-technology-october-2010, Jul. 9, 2011.
Renewable Energy Focus, "Indesit R:tec and npower dynamic demand smart grid technology", http:www.renewableenergyfocus.com/view/5041/indesit-ritec-and-npower-dynamic-demand-smart-grid-technology, Nov. 5, 2009.
Anslow, Mark, "How smart fridges could slash UK CO2 emissions and help renewables", http://www.theguardian.com/environment/2009/apr/27/carbon-emissions-smart-friges-environmentally-friendly-appliances, Apr. 28, 2009.
Johal, Harjeet et al., "Supporting Cold Load Pickup with Demand Response, Appliances National Town Hall Meeting on Demand Response and Smart Grid", Jul. 13, 2011 http://billstron.com/documents/Harjeet%20Johal%20%28GE%29%20-%20NAP%20Tech.pdf.
Flohr, Daniel, "Making the Case for Grid-interactive Electric Water Heating in 2014, Frequncy Regulation: The Holy Grail", 15th PLMA Spring Conference, Apr. 14, 2014, http://c.ymcdn.com/sites/www.peakload.org/resource/resmgr/2014_GIWH_Workshop/Flohr.pdf.
Open Energi, Demand Response Market Overview V1, http://www.openenergi.com/downloads/OE%20Demand%20Response%20Market%20Overview%20V1.pdf, Apr. 2013. 7 pages.
Ricci, A. et al., "Power -Grid Load Balancing by Using Smart Home Appliances", Consumer Electronics, Digest of Technical Papers. International Conference, Jan. 9-13, 2008, @2008 IEEE, 2 pages.
Dynamic Demand, http://www.dynamicdemand.co.uk/index.htm. page consulted on Aug. 25, 2014.
Grid Friendly™ Appliance Project, Pacific Northwest GridWise™ tested Demonstration Project, PNNL-17079, Oct. 2007, 123 pages.
Jul. 29, 2013—(CA) Examiner's Report—Appln 2817822.
Feb. 7, 2014—(CA) Notice of Allowance—Appln 2817822.
Jul. 23, 2015—(CA) Examiner's Report—Appln 2809896.
Jun. 23, 2015—(CA) Examiner's Report—Appln 2817822.
Jul. 6, 2015—(CA) Examiner's Report—Appln 2856433.

(56) References Cited

OTHER PUBLICATIONS

Feb. 2, 2016—(EP) Extended Search Report—App 13796465.6.
Feb. 27, 2017—(US) Non Final Office Action—U.S. Appl. No. 14/404,883.
Nov. 2, 2017—(US) Final Office Action—U.S. Appl. No. 14/404,883.
Feb. 2, 2016—(US) Office Action U.S. Appl. No. 13/368,824.
Jul. 14, 2015—(US) Restriction Requirement U.S. Appl. No. 13/682,824.
May 31, 2018—(US) Office Action—U.S. Appl. No. 14/404,883.

* cited by examiner

POWER CONTROL DEVICE

CROSS REFERENCE TO RELATED APPLICATIONS

This is a continuation application based on Ser. No. 13/682,824 filed Nov. 21, 2012 entitled "Power Control Device" which claims priority to Canadian application Serial No. 2778345 filed Jun. 1, 2012 entitled "Power Control Device" for which priority is claimed in its entirety.

FIELD OF THE INVENTION

The present invention relates to a controller for controlling the power consumed by a load connected to an AC supply. The invention also extends to control strategies for such load control function. In a specific and non-limiting example of implementation, the invention finds applications in electrical power grids to improve the grid frequency stability.

BACKGROUND OF THE INVENTION

To ensure the reliability of an electric power grid, the administrator must continually maintain a power reserve in order to compensate for a possible failure of energy production units. The power reserve is essentially an excess production capacity on standby. In normal conditions, the power generation units are run at less than 100% such that a degree of reserve power is always available. However, the maintenance of this reserve capacity is an expensive proposition since the reserve constitutes a resource that cannot be effectively monetized by the utility company.

An electric power grid will operate in normal conditions at a fixed frequency (usually 50 or 60 Hz). The frequency remains constant as long as the supplied power matches the power consumed by the load. Any sudden changes in generation or load resulting in an unbalance between generation and load will lead to a frequency instability during which the frequency deviates from its nominal value. Large frequency variations are undesirable because they could lead to equipment trip or even a system collapse.

Frequency instability events are generally caused by the sudden loss of a power generation unit or by the loss of a large load and are characterized by a sudden frequency variation from the frequency nominal value.

The reserve capacity in a power grid is thus tapped when the frequency drops below a certain level. Electrical generation units that supply power to the grid are equipped with a speed governor. The speed governor continuously regulates the power output of generation units in order to balance the generation with the load. Thus when the frequency of the grid varies, the speed governor responds to this variation to compensate it. For example, when the frequency is higher than normal, the speed governor will simply lower the power generated by the generation unit (therefore reducing the amount of power supplied to the grid). Alternatively, when the frequency is lower than normal, the speed governor will increase the power generation. The speed governor however has some inherent limitations. In particular, it is slow to respond since it involves certain mechanical constraints. Depending of the type of generation (hydraulic, gas, thermal, wind, etc . . . ) some time is required for the generation unit to increase its speed up to the desired point.

System inertia is another aspect to frequency stability of the power grid. "Inertia" refers to the ability of the grid to buffer energy imbalances, such as excess load or excess generation and thus prevent significant and rapid frequency variations. Any power grid has a level of inherent inertia on its generation side. This inherent inertia is in the form of mechanical energy stored in the rotors of the generators. If the load on the power grid increases, the rotor inertia of a generator will be able to instantly respond to this increased load and thus dampen a frequency drop. Similarly, if the load connected to the grid is suddenly reduced, the rotor inertia will limit its tendency to overspeed, hence increase the frequency of the supply voltage.

Accordingly, from the perspective of frequency stability, some level of inertia in the power grid is desirable because it acts as a mechanism to dampen frequency variations and thus provides more time for slower frequency stabilization systems to become active.

SUMMARY OF THE INVENTION

According to a broad aspect the invention provides a power control device for regulating the power that a load consumes, on the basis of the AC supply frequency. The system includes decision logic that responds to a frequency deviation to implement a power regulation strategy. The power regulation strategy includes a power compensation phase during which the electrical power that the load consumes is adjusted (reduced or increased) to balance the load on the grid. The power regulation strategy also includes a power restoration phase during which the power to the load is restored (either increased or decreased). The rate at which the power is adjusted during the power compensation phase is higher than the rate at which the power is restored during the power restoration phase.

This approach allows increasing the frequency stability of the grid by restoring the load at a rate which is relatively slow, thus avoiding a load spike or dip that can trigger a secondary frequency instability event. At the same time, the power compensation can be implemented very quickly to rapidly respond to a frequency deviation which is indicative of overloaded or an under loaded grid.

In a specific and nonlimiting example of implementation, the power control device operates independently without external control input other than the AC frequency. This makes the installation and deployment of the system simple since there is no need to install a dedicated communication channel to carry commands to the device.

The power control device can be coupled to a household appliance to regulate its power consumption. Examples of such household appliances include resistive heating devices such as water heaters, air heating systems and clothes dryers, among others. Resistive loads allow a continuous form of power regulation during which electrical power that the appliance consumes is adjusted by a degree that matches the level at which the AC frequency has deviated. Thus, when a power reduction is being implemented, such power reduction does not completely negate the functionality of the appliance. For instance, in the case of a water heater, water will still be heated albeit at a lower rate. Also, resistive loads are easier to manage during the power restoration phase since the system can gradually increase the amount of power that the appliance can consume in order to avoid a load spike.

From that perspective, continuous power regulation is to be distinguished from a binary form of control where power to the load is completely cut off during a power reduction and then instantly and fully turned on during the power restoration. The downside of this approach is that the full power restoration is likely to overload the grid, essentially re-creating the problem that the power reduction intended to solve.

A variant of the continuous power regulation approach is to allow power regulation including multiple discrete steps. The discrete steps include a full power step where the load is allowed to consume its nominal amount of power, a no power step were no electrical power is supplied to the load and one or more intermediate steps where intermediate levels of electrical power are supplied to the load. The number of intermediate power steps can vary depending on the intended application, but at least one is required.

By installing the power control device in a large number of individual dwellings supplied by the power grid, an aggregate control effect can be achieved to provide meaningful frequency stabilization.

In another broad aspect, the invention provides a system for regulating the power that a load is allowed to consume on the basis of the AC supply frequency. The system includes decision logic that responds to a frequency reduction to reduce the amount of electrical power to the load. The system can also recognize frequency encoded messages to implement certain commands, such as partial or full load shedding (commands to be implemented immediately or after a certain time delay) and deactivate the power reduction strategy for a certain time, among others.

In a specific example of implementation, the AC frequency encoded messages convey information that the system recognizes and responds to. Information can be frequency encoded by generating frequency variation patterns that the power control device which observes the AC frequency can recognize. The frequency variations are small to avoid negative effects on equipment supplied by the grid. Also, the frequency variations are such as to avoid triggering the load reduction response of the system. In a specific and non-limiting example of implementation, the frequency variation does not exceed 25% of frequency variation that is considered acceptable in a power network before any corrective measures are implemented. The frequency variation that is considered "acceptable" would depend on the type of power grid. For isolated power grids larger variations can be tolerated than in power grids that are interconnected to other power grids.

For instance, the frequency variation pattern can be limited to frequency excursions in the range from 60.1 Hz to 59.9 Hz, when the nominal supply frequency is 60 Hz. This could be suitable for an isolated power grid.

For an interconnected power grid the frequency variation pattern can be limited to frequency excursions in the range of 60.01 Hz to 59.99 Hz.

For clarity, the frequency variations considered acceptable during the steady state operation of the power grid do not constitute a frequency instability. As it will be discussed later, "frequency instability" refers to more significant frequency deviations, which require rapid correction. Typically, the loss of a power generation unit causes a frequency instability.

The frequency encoded messages can thus be used to control the power regulation behavior of the power control devices. This can be useful for testing purposes or during contingencies when a certain type of response is more desirable than another. In the case of testing, the grid operator adjusts the frequency of the AC supply to impress on it the desired message which is then sensed by the multiplicity of power control devices connected to the grid. In a specific example, the message can be such as to direct the power control devices to reduce the power of the loads associated with them. By observing the resulting behavior of the grid, the operator can more precisely ascertain the collective level of load reduction that is available and that can be effectively relied upon to provide frequency stabilization. The operator can also ascertain the profile of the load reduction response, in particular the time to reduce the load by a certain amount.

In yet another broad aspect, the invention provides a method for a grid operator to determine the degree of load reduction available for frequency stabilization purposes, where the grid supplies electrical loads, some of which are controlled by power control devices that reduce the amount of electrical power available to the load when the AC frequency drops below a certain level. The method includes the step of impressing on the AC supply a frequency encoded message directing the power control devices to reduce the electrical power available for the load and observing the effect of the collective reduction on the grid.

The frequency encoded message can be structured in different ways. One example is to design the system to operate on the basis of a predetermined number of messages, where each message is represented by an individually recognizable frequency variation pattern. The power control device is designed to recognize the frequency variation patterns and implement the actions that are associated with the patterns. Alternatively, the message may have a structure allowing conveying multiple elements of information. This is a more flexible approach since it allows for more communication possibilities. In a specific example of implementation, the message includes a command portion that basically tells the power control devices what to do. In addition, the message also includes a time variable portion that conveys in addition to the command portion time information such as a delay or specific time at which the command is to be implemented and/or the duration for the action that the command entails.

As embodied and broadly described herein, the invention thus provides a power control device for use in an AC power grid for controlling an amount of electrical power a load that is supplied by the AC power grid consumes. The power control device has a frequency sensing functional block for detecting deviations of the grid frequency from a nominal grid frequency and a logic functional block for implementing a power regulation process. The power regulation process implements a power compensation phase during which the amount of power the load consumes is adjusted in dependence of a detected deviation of the grid frequency and a power restoration phase during which the amount of power the load consumes is restored, the power compensation phase varying the electrical power the load consumes at a rate that is higher than the rate at which the electrical power is varied during the power restoration phase. The power control device also includes an output for outputting a control signal for controlling the power the load consumes on the basis of the power regulation process.

As embodied and broadly described herein the invention further provides a power control device for use in an AC power grid for controlling an amount of electrical power a load that is supplied by the AC power grid consumes. The power control device has a sensing functional block for detecting a frequency instability event and a logic functional block for performing a power regulation process that implements a power reduction phase during which the amount of power the load consumes is reduced in response to detection of a frequency instability event and a power restoration phase during which the amount of power the load consumes is increased, the power reduction phase reducing the electrical power the load consumes at a rate that is higher than the rate at which the electrical power is increased during the power restoration phase. The power control device also includes an output for outputting a control signal for controlling the power the load consumes on the basis of the power regulation process.

As embodied and broadly described herein, the invention also provides a method for improving the frequency stability of an AC power grid to which are connected a multiplicity of loads, the loads are geographically distributed and remote from one another. The method includes performing for each load a power consumption regulation function that includes:

a. sensing a frequency of the AC power supplied by the AC power grid at the load site to detect a frequency instability event;

b. reducing the electrical power the load consumes in response to detection of a frequency instability event;

c. increasing the electrical power the load consumes when the sensing indicates that the frequency deviation subsides or has dissipated, the power being increased at rate that is slower than the rate at which power is reduced.

As embodied and broadly described herein the invention also provides a power control device for use in an AC power grid for controlling an amount of electrical power a load that is supplied by the grid consumes, the power control device comprising:

a. a sensing functional block for detecting a frequency instability event;

b. a logic functional block for generating a control signal in response to the detecting of the frequency instability event to reduce the power the load consumes, in the absence of a frequency instability event the logic functional block being responsive to a frequency encoded message impressed on the AC power grid to execute a command conveyed by the frequency encoded message;

c. an output for outputting the control signal for reducing the power the load consumes.

As embodied and broadly described herein, the invention yet provides a process for determining a degree of load reduction a power grid manifests in response to a frequency instability event, where the grid supplies a multiplicity of loads which are geographically distributed and remote from one another and each load is controlled by a power control device. The power control device reduces the amount of electrical power the load is allowed to consume in response to a frequency instability event. Further, the power control device is responsive to a frequency encoded message impressed on the power grid to reduce the electrical power the load is allowed to consume. The process for determining the degree of load reduction includes impressing on the power grid the frequency encoded message to command the power control devices associated with the respective loads to reduce the electrical power the individual loads are allowed to consume, the impressing being performed in the absence of a frequency instability event, and observing a collective response of the multiplicity of loads to the frequency encoded message.

As embodied and broadly described herein the invention further encompasses a combination of power control devices which control the electrical power that respective loads consume from a power grid, wherein the loads are geographically distributed and remote from one another. Each power control device has a sensing functional block for detecting a frequency instability event over the power grid and a logic functional bock for performing a power regulation process that implements: (1) a power reduction phase during which the amount of power the respective load consumes is reduced in response to detection of a frequency instability event and (2) a power restoration phase during which the amount of power the respective load consumes is increased. The power reduction phase implemented by individual ones of the power control devices defining in combination a collective power reduction action, the power restoration phase implemented by individual ones of the power control devices defining in combination a collective power restoration action, the collective power reduction action reducing power consumption from the power grid at a rate that is faster than the rate at which the collective power restoration action increases power consumption from the power grid.

As embodied and broadly described herein, the invention further encompasses a power control device for use in an AC power grid for controlling an amount of electrical power a load that is supplied by the AC power grid consumes. The power control device has a sensing functional block for detecting a frequency instability event and a logic functional bock for performing a power regulation process. The power regulation process implements a power compensation phase during which the amount of power the load consumes is reduced in response to detection of a frequency instability event and a power restoration phase during which the amount of power the load consumes is increased, the power compensation phase having a duration that is less than a duration of the power restoration phase.

BRIEF DESCRIPTION OF THE DRAWINGS

A detailed description of non-limiting examples of implementation of the present invention is provided hereinbelow with reference to the following drawings, in which.

Figure 1:
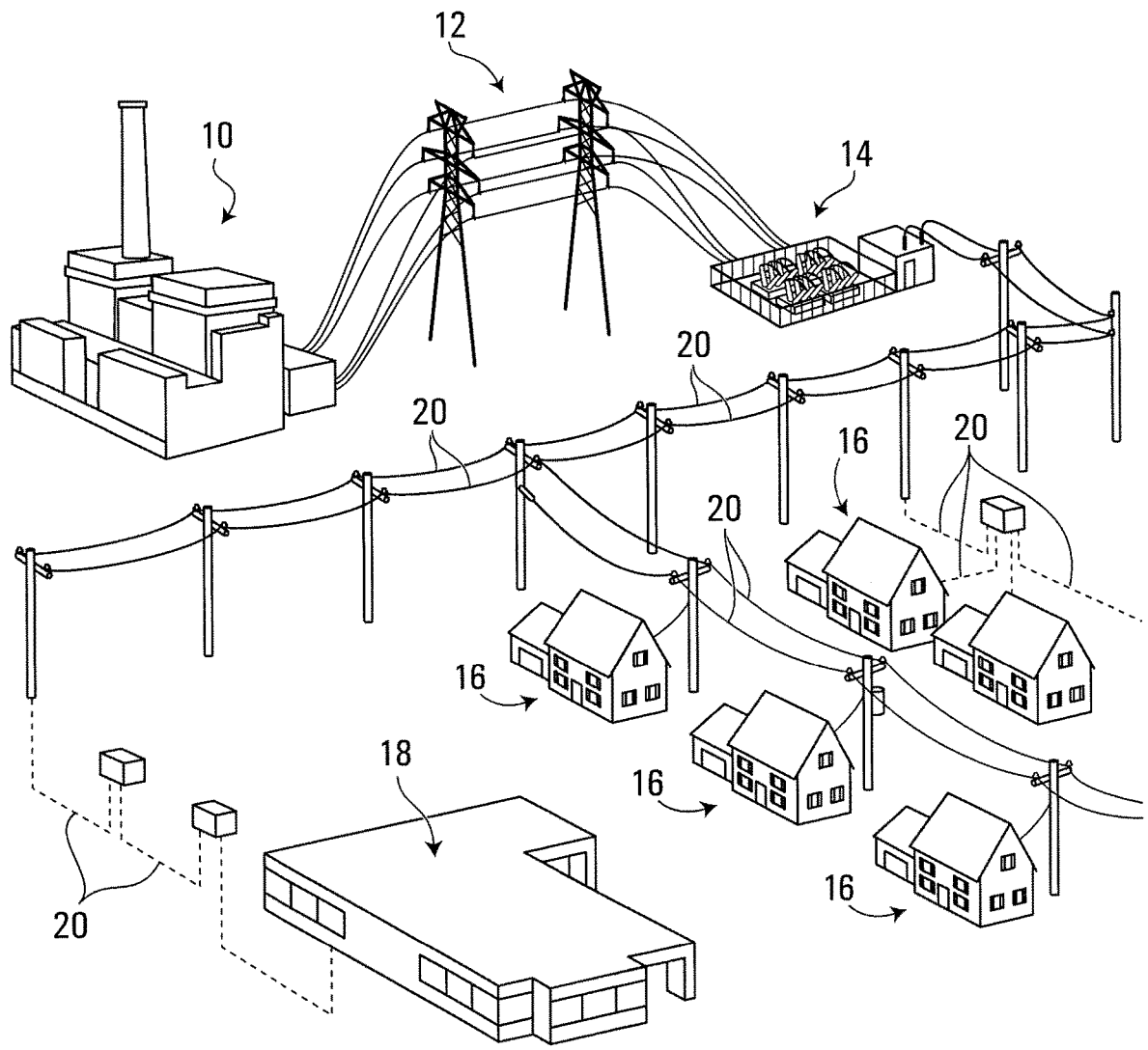
FIG. 1 shows an example of an electrical power grid, illustrating the power generation side and the distributed load side of the power grid.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION OF THE EMBODIMENTS OF THE INVENTION

To facilitate the description, any reference numeral designating an element in one figure will designate the same element if used in any other figure. In describing the embodiments, specific terminology is used but the invention is not intended to be limited to the specific terms so selected.

FIG. 1 shows an electric power grid. Electricity is generated at a power plant 10 and is transmitted over high voltage transmission lines 12 to a voltage down step station 14. The voltage down step station 14 lowers the electrical voltage (via transformers for example) such that it may be distributed to households 16 and industrial buildings 18 via residential distribution lines 20.

In a specific example of implementation, the present invention provides a power control device 32 that can regulate the electrical load that household appliances or industrial equipment is allowed to consume. By using a sufficient number of such power control devices, a significant portion of the grid load is controllable and can thus provide a significant effect on the overall power demand. Accordingly, the power control can be invoked to lower the electrical load in periods of peak demand and/or when a power generation unit fails, thus reducing the production capacity.

Figure 2:
FIG. 2 is a bloc diagram of a power control device in accordance with a non-limiting example of implementation of the invention used to regulate the electrical power that a load is allowed to consume, based on the AC frequency.

FIG. 2 is a diagram of the power control device 32, showing the power control device 32 connected to an AC supply 30 (which is the power grid) and to an electrical load 34. The power control device 32 monitors the frequency of the AC supply 30. If the frequency varies from its nominal value, the power control device 32 reacts accordingly to reduce the load accordingly or in exceptional cases to increase it.

Figure 3:
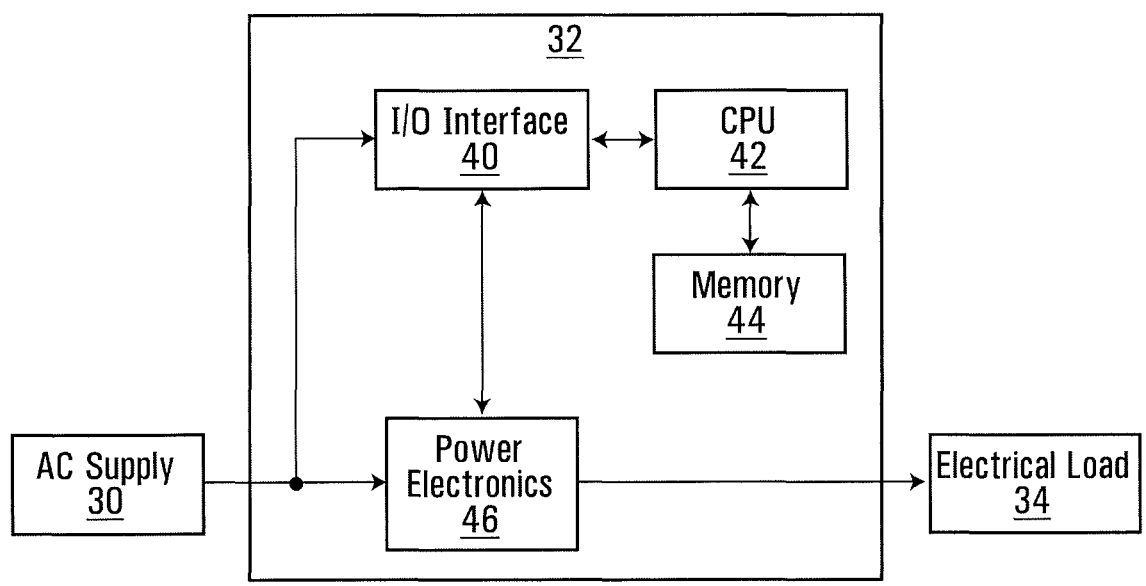
FIG. 3 is a more detailed bloc diagram of the power control device shown in FIG. 2.

With reference to FIG. 3, a more detailed bloc diagram showing the different components of the power control device of FIG. 2 are shown. The power control device 32 is computer based and uses software to interpret the AC frequency and implement the desired load regulation strategy. More specifically, the power control device 32 has an input/output interface 40, a CPU 42, a machine readable storage 44 and power electronics 46. Signals representative of the AC frequency are communicated to the power controller 32 via the input/output interface 40. The input/output interface 40 reads the frequency information, digitizes it and makes it available to the CPU 42 for processing.

The machine readable storage 44 is encoded with software executed by the CPU 42. The software implements the power regulation strategy. The I/O interface 40 outputs control signals that are generated by the software to command power electronics 46 for performing the actual power control. The power electronics 46 typically would include thyristors or power transistors that can lower the RMS voltage supplied to the electrical load 34. The power electronics 46 can simply chop segments of the voltage wave to effectively lower the RMS supply voltage hence, the amount of power the load consumes.

The control signals output from the I/O interface 40 convey information indicating the amount of power reduction desired. In response to these control signals the power electronics 46 control the AC voltage wave accordingly.

Examples of Loads that can be Controlled

The loads that are the most suitable to be controlled by the power control device 32 are resistive loads. The power consumed by a resistive load can be adjusted by varying the supply voltage to provide a continuous range of power consumption regulation.

Another example of a load that also can be controlled by the power control device 32 is a load that consumes power at several discrete levels. In such case, the power control device varies the power consumption of the load by selecting the maximal level of power consumption of the load. Note that in the latter case, the power control device may not need to adjust the AC voltage that is applied to the load. Rather, it sends control signals to the load to direct the load to cap its power consumption at a particular level.

In one specific example of implementation, the electrical load 34 is a water heater in a dwelling. If a decrease in the power consumption of the water heater is necessary, the power electronics 46 will reduce the supply voltage according to the programmed control strategy to obtain the desired power consumption reduction. The decrease in power level can be enforced for a short period of time (for example, ten to thirty minutes) to avoid an excessive cooling of the water load. In this particular example it is unlikely that the power consumption reduction will affect in a major fashion the functionality of the apparatus and would be almost imperceptible to the end user. The large thermal mass of the water load (assuming that it is at the set point temperature when the load reduction was initiated) may reduce the water temperature by a few degrees and be virtually unnoticeable by the end user. As will be further discussed below, such an effect would be even less perceptible if the power control occurs at times during which the water heater is not being heavily used, such as during the night.

Another example of a load suitable to be controlled is a heating system in a commercial building or a home. In such embodiments, if it is necessary to decrease the power consumption of the load, the power controller 32 can instruct the heating system to reduce the consumed power for a period of thirty minutes for example. During such a control period, it can be understood that the overall temperature of the commercial building or home may not vary greatly. Hence, such a variation to the end user would once again be small. Note that the heating system may be of resistive nature (electrical heating elements) that can be regulated via the power electronics 46.

Alternatively, the heating system may be regulated simply by lowering the temperature set point. Consider the situation where the user sets the thermostat of the dwelling at 20 degrees Celsius. In a normal mode of operation, the heating system is controlled such as to maintain that temperature level. The control adjusts in a continuous fashion the amount of power supplied to the load depending on the temperature error (the difference between the set point and the actual temperature). The amount of heating power the heating system dispenses at any given time is controlled by power electronics in the thermostat such that as the actual temperature gets closer to the set point, the heating power supplied is reduced to avoid overshoots. Maximal heating power is supplied when there is a large spread between the actual temperature and the set point. When the power control device 32 commands a reduction of the power consumption of the heating system, it does so by reducing the temperature set point to by a value commensurate with the degree of reduction desired. In the above example, the set point can be reduced by 1 degree to 19 degrees, which will for all practical purposes be imperceptible to the user. In this example, of implementation, the power control device 32 can be integrated into an electronic thermostat that already uses a power electronics stage to control the heating system. More specifically, if the thermostat uses a computer based electronic control system, the power control functionality can be implemented by loading the software code which will monitor the AC frequency and issue the necessary control signals to the existing power electronics stage.

In another example of implementation, power control of a heating system can be effected without changing the temperature set point but rather the strategy used by the thermostat to track the set point. In this example, the power control device adjusts the responsiveness of the control strategy, reducing the system gain when the electric power consumption is to be reduced. With a lower gain, the heating system will track the set point less aggressively and while the temperature can still reach the set point it will take longer to do so.

Yet another example of a load suitable to be controlled would be an industrial facility implementing a process that requires a significant amount of electrical energy but whose power consumption can be reduced to some degree over a certain period of time without any major drawback on the process itself. An example is an aluminum smelter.

Another example of an apparatus to which a power controller can be connected is an oven for food preparation purposes. For example, if the oven is set to operate at a temperature of 450° F., a reduction in power supplied to the oven for a short period of time will not drastically change the temperature of the oven. The oven control can be similar to the heating system control described earlier.

Electrical vehicle charging is yet another example where power control is possible. In this example, a reduction in the amount of power made available to a charging station would simply increase the amount of time needed to charge the vehicle. In some embodiments, this could represent an increase of thirty minutes to an hour which would be largely unnoticeable by the end user, especially if the charging takes place at night when the end user is less likely to use the vehicle.

Note that the electrical vehicle charging stations is an example in which power control may need to occur at discrete levels. It is known that an electrical vehicle can be charged at either 220/240V or 110/120V. Charging at a higher voltage is generally desirable because the charging time is reduced. A power regulation strategy may involve lowering the charge voltage from 220/240V to 110/120V for some period of time during which a load reduction is desirable and then raising the voltage back to 220/240V. The voltage switch can be done in any way known in the art but the process may also require communication with the vehicle (that usually includes some control logic) to notify the logic that the charging rate will change.

Yet another example of the load that could be controlled by the power control device 32 is a clothes dryer. The clothes dryer includes a heating system that can be regulated in a continuous fashion as described earlier. In a period of usage, the power control device 32 can reduce the amount of electrical power made available to the heating system of the dryer. From the point of view of the end-user, this electrical power reduction will translate into a longer drying time.

Power Regulation Strategy

Figure 4:
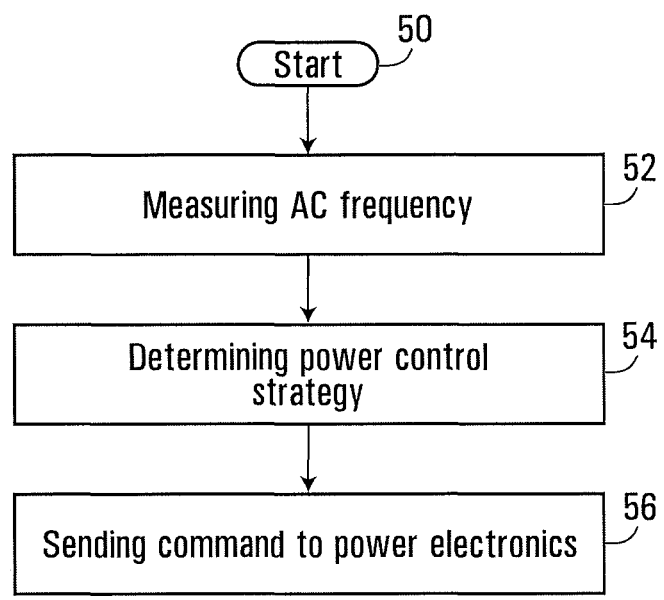
FIG. 4 is a flow chart of the process implemented by the power control device for controlling an electrical load.

FIG. 4, illustrates a flow chart of an example of the process implemented by the power control device 32 for controlling an electrical load. After the power control device 32 is in an active state (generally represented by a "Start" condition at step 50), the logic of the power control device 32 proceeds to step 52 where the AC frequency is measured to determine if a power regulation strategy needs to be implemented.

The purpose of the AC frequency assessment is to detect an unbalance between the generation side of the grid and the load side thereof, which is reflected by the frequency deviation. Typically, the larger the deviation the larger the unbalance is. The output of step 52 is thus a frequency value. Since the power control device 32 performs digital data processing, the frequency value is preferably generated in a digital format. Any suitable methodology can be used to convert the AC analog waveform into digital frequency information. A possible refinement is to perform several frequency measurements and to compound those measurements into a single representative value, such as by averaging them. Specifically, the power control device 32 is programmed to acquire over a predetermined period of time a frequency measurement which is stored in the memory of the power control device 32. In a specific example a frequency measurement can be made at every 100 ms interval, but this value can vary without departing from the spirit of the invention. Generally, measurement interval depends on the processing speed of the CPU 42; the faster the CPU 42 and the system overall, the larger the number of frequency measurements in a given time period.

The frequency measurement is done by computing the period of one or more consecutive cycles of the AC voltage and deriving from the period information the fundamental frequency. When the frequency is measured at each 100 ms, and assuming a 100 ms measurement window, the system measures the period of at least one AC voltage cycle within that 100 ms window.

The memory of the power control device 32 keeps a certain number of frequency measurements. As a new measurement becomes available, it is stored in the memory and the oldest measurement overwritten. All the frequency values that are stored in the memory are averaged as a new frequency measurement becomes available. The average measurement smoothes out short term frequency variations that may not be representative of the grid frequency stability.

Note that instead of averaging the frequency measurements, other ways to blend this data into a single representative value exist without departing from the spirit of the invention.

Thus, the output of the processing at step 52 is a compound frequency measurement on the basis of which the power regulation strategy is determined. The power control device 32 implements decision logic based on the compounded frequency measurement in order to determine the control strategy to be employed. Subsequently, the power control device 32 sends a corresponding command to the power electronics 46 (via control signals, for example) as represented by step 56 to be described later.

Step 54 of the process thus uses the compounded frequency measurement as an input in determining if power control is required and optionally the strategy to be employed (when different strategies can be used). In instances when the distribution grid is stable and the frequency is within a nominal acceptable range the processing at step 54 determines that no power control is necessary and no further action takes place. This processing loop repeats constantly to provide a continuous monitoring of the grid frequency stability. However when the compounded frequency reflects a degree of grid frequency instability, step 54 invokes a power control response.

Generally, the power regulation strategy has two main phases. The initial phase is a response to a grid frequency instability event. The purpose of this response is to adjust the power consumed by the electrical load 34. In this specification it is referred to as "power compensation". It is advantageous to perform the power compensation as quickly as possible in order to stabilize the frequency of the AC supply. From that perspective, a fast system response is a desirable attribute. Note that in most cases, the power compensation will be a power reduction since most frequency instability events are caused by a sudden loss of a power generation unit.

The degree of power reduction is related to the severity of the frequency instability. The larger the instability, the more significant the power reduction will be. The specific relationship between the frequency instability and the degree of power reduction can be linear or nonlinear.

When a large number of power controllers 32 are installed in the electrical network or grid, each of them responds independently to the frequency instability event. However, since the responses are coherent and predictable they all add up to a combined load reduction that has a grid-wide effect.

The second phase of the power regulation strategy is the power restoration phase. During this phase the electrical power that the load 34 consumes is restored. The restoration can be either an increase of power (if the initial response was a decrease of power to address the loss of a power generation unit) or a decrease of power (if the initial response was an increase of power to address a grid under load condition). Again, most practical cases would fall in the first category since the majority of the frequency instability events are due to a loss of a generation unit. An important consideration during the power restoration phase is to perform this restoration without triggering a further frequency instability event by overloading or under loading the grid which is likely to occur if the power restoration is performed at once. For that reason the power restoration is performed at a rate which is slower than the rate at which power was initially adjusted.

For clarity, the expression "power restoration performed at a rate which is slower than the rate at which power was initially adjusted" or any other equivalent expressions that may be used in the specification means that it takes less time to adjust initially the power to the load 34 from the level at which it was when the frequency instability event was detected (initial power level) to another level (adjusted power level) than it takes to restore it back from the adjusted power level to the initial power level, once it is determined that the frequency instability event is subsiding or is no longer present. This definition applies from the perspective of the individual power control device 32, the power grid or both.

In a specific example of implementation where power is restored by increasing the power that the load 34 is allowed to consume, the power control device 32 increases the power the load is allowed to consume in a gradual manner.

In a different example of implementation the individual power control devices 32 restore the power to the load in a non-gradual stepwise fashion. Advantageously, the individual power control devices 32 do so in a non-synchronized way over a predetermined time period and the net effect on the grid is still a somewhat progressive and continuous load increase.

Figure 5:
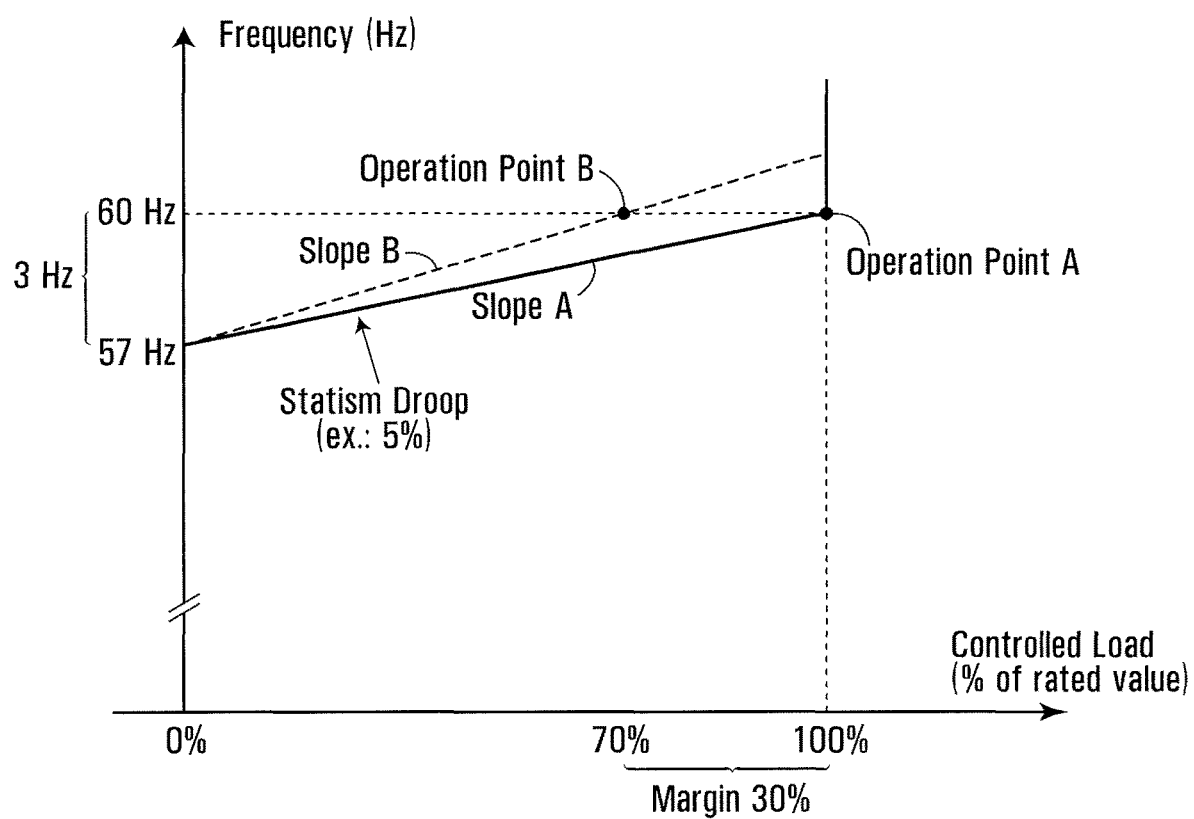
FIG. 5 is a graph which provides a specific example of a power regulation strategy in relation to the AC frequency.

FIG. 5 is a graph depicting several specific examples of the power compensation phase of the power regulation strategy in relation to the AC frequency. In a first example, which is effective when the AC frequency is reduced as a result of a loss of a power generation unit, the response is represented by a line of constant slope (slope A) which establishes a linear relationship between the grid frequency and the allowable power the load 34 can consume. Operation point A occurs at a rated frequency of 60 Hz when the load is fully supplied (100% supplied). However, when the frequency is decreasing below the rated value to a point at which a frequency instability event is considered to be occurring the electrical power available to the load 34 is reduced proportionally to the frequency deviation. The rate at which the load 34 is reduced in relation to the frequency can be set to any desired value. For example, in the embodiment shown in FIG. 5, a frequency drop of 5% (3 Hz) will result in no power being consumed by the load. The value of this slope corresponds to the frequency variation (in percentage) that creates a load variation of 100%. Note that such a drop value (5%) fits with the standard settings of speed governors of power plants. In other examples of implementation, the drop can be set to values less than 5%. In yet other embodiments, the drop can be set to values above 5%.

Slope A provides a load reduction response that is effective against a frequency drop in the grid caused by the loss of a generation unit. However this load reduction response is not effective in instances where the frequency of the grid increases beyond its nominal value, that is due to an under load situation.

More particularly, it can be seen that if the frequency of the AC supply increases beyond its rated value, the load will be maintained fully supplied (i.e.: the load will not increase to respond to an increase in frequency). This is because a load cannot be supplied beyond the maximum value for which it has been designed. Therefore, in order to accommodate increases in frequency that would necessitate an increase in load beyond the rated value, a different strategy can be considered where the load is supplied at less than 100% of the rated value when the frequency is at its nominal value. For example, with reference to the line of slope B of FIG. 5, an example of implementation of a different power compensation response is shown wherein the power control device operates the load (operation point B) at about 70% of the rated value when the frequency is nominal. In this embodiment, if the frequency of the AC supply increases above 60 Hz, the power control device will be able to increase the power supplied to the load. The operation point at the nominal frequency can be set to any desired value such as to accommodate both increases and decreases in frequency. In some embodiments, the determination of the operation point can be made in terms of historical data, wherein the operation point is chosen such as to accommodate a maximum possible value of frequency that has previously been attained. Thus, it can be appreciated that the operation point can be set to any percentage of the rated value deemed suitable.

Figure 6:
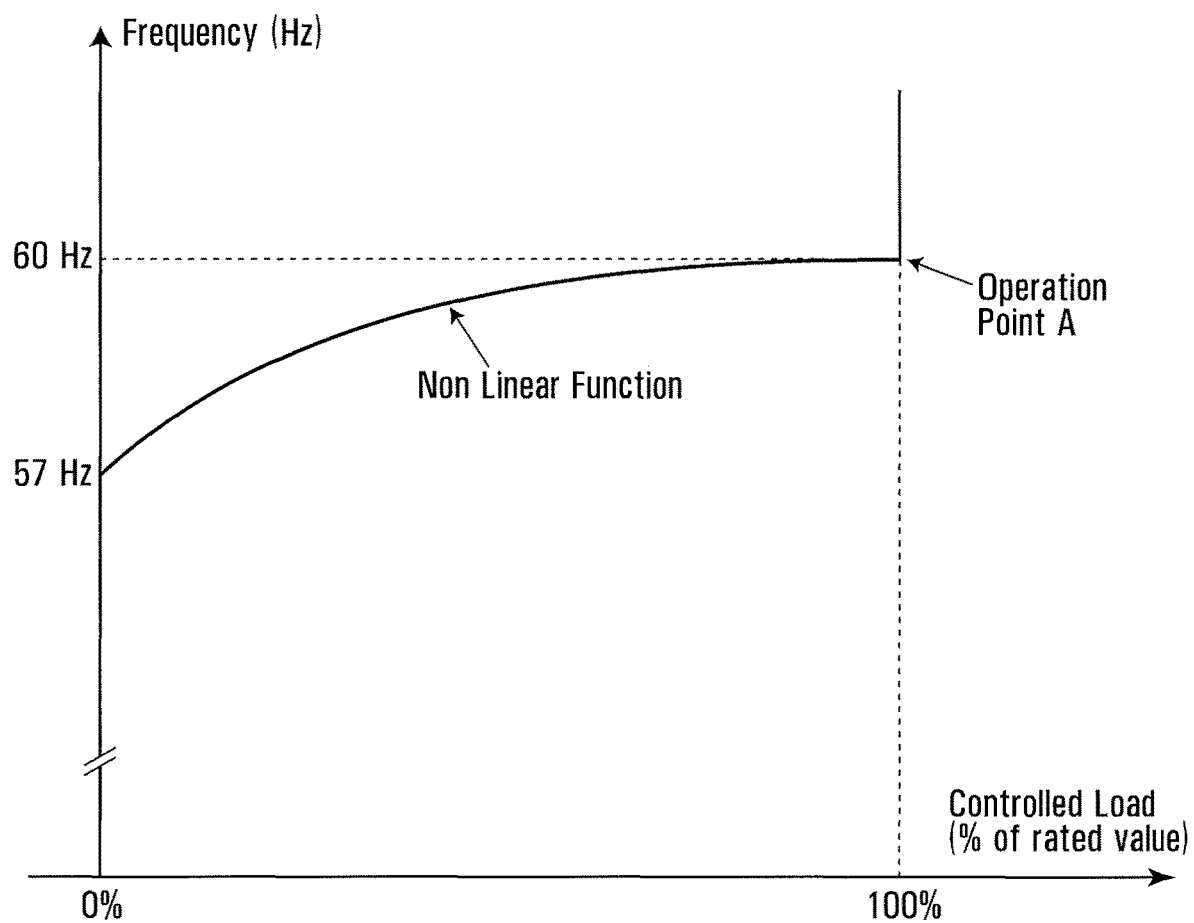
FIG. 6 is a graph which provides a specific example of a non-linear power regulation strategy that is also in relation to the AC frequency.

Both power compensation examples illustrated in FIG. 5 are based on linear relationships between frequency and controlled load (% of load rated value). Alternatively, the variation in controlled load in relation to the variation in frequency can also occur in a non-linear manner as shown in FIG. 6. The non-linear function has the advantage of providing a more aggressive load reduction effect with increasing frequency drop.

Figure 7:
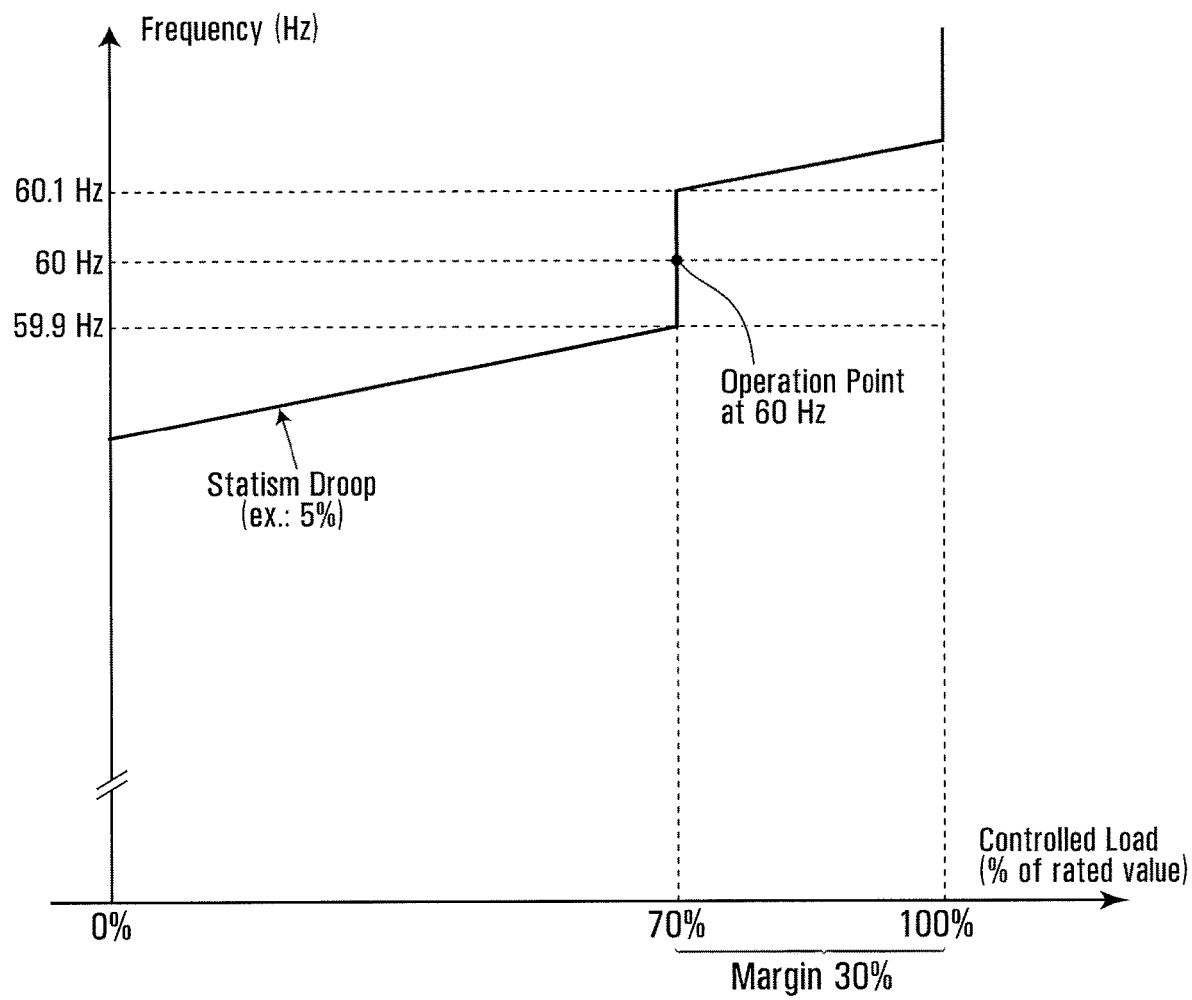
FIG. 7 is a graph which provides another example of a power regulation strategy that has a dead-band within which little or no power control takes place.

With further reference to FIG. 7, an example of a power compensation is illustrated which implements a dead band where no power control takes place as long as frequency variations are within the dead band boundaries. The dead band spread can be set on the basis of a frequency variation window within which frequency variations occur but are considered normal. In other words, as long as the frequency remains within that frequency variation window the frequency of the power grid is considered to be stable and no frequency instability is occurring. A frequency instability occurs when the frequency exceeds the window boundaries. In the example of FIG. 7, the nominal AC frequency is at 60 Hz, and the frequency variation window, which is centered on the 60 Hz value has a spread of ±0.1 Hz. This means that as long as the AC frequency remains within that window, it is considered stable and it will not invoke any power compensation response. However, a variation in frequency outside the range of ±0.1 Hz from the operation point at 60 Hz will cause the power control device 32 to increase or decrease the power consumed by the load accordingly.

The power regulation strategy also implements a power restoration phase during which the power the load consumes is restored to its original value. The power restoration phase includes at least one power control action and optionally two consecutive power control actions. The single power control action is a power variation (power increase or power decrease to the load). The optional power control action is the power maintenance action during which the power to the load is maintained (held steady) for a certain duration. The power maintenance action precedes the power variation action.

The power restoration phase is triggered when the frequency instability event is subsiding. The determination of the trigger point of the power restoration phase is made on the basis of the frequency of the AC supply.

In a specific example of implementation, the power restoration phase is triggered at about the same time the frequency variation peaks. In the instance the frequency instability event is the result of a loss of a power generation unit, the frequency variation peak will correspond to the maximal downward frequency excursion. The maximal downward frequency excursion is detected by sensing the frequency rate of change versus time. Below a certain level of frequency decrease, it may be assumed that the frequency variation peak has been reached or will shortly be reached. For example, when the frequency decreases at a rate less than 0.01 Hz/sec, the power restoration phase is triggered.

During the power variation action of the power restoration phase, the power that the load is allowed to consume is restored at its original level (increased or decreased depending on the reason for the frequency instability event) over a time period that is sufficiently long to avoid triggering a secondary frequency instability event. More specifically, the power to the load is varied at a lower rate than the rate at which the power was adjusted (reduced or increased) during the power compensation phase. In other words it takes less time to bring the power consumed by the load from level A down to level B (assuming the power compensation responds to a drop of frequency) to bring it back up to level A from level B.

During the power variation action, the rate of power variation is determined by measuring the time from the moment the power starts to increase from level B to the moment the power has reached level A. Similarly, during the power compensation phase, the rate of power variation is determined by measuring the time over which the power reduction from level A down to level B occurred.

The power restoration phase may include a minimal time delay before the power to the load starts increasing. For example, the delay may be set to anywhere from about 2 seconds to about 2 hours, more preferably from about 5 minutes to about one hour and most preferably from about 10 minutes to about 30 minutes. Accordingly, once the power restoration phase starts, a timer is started programmed with the desired delay period. Concurrently with the start of the power restoration phase, the power maintenance action is initiated, during which the power to the load is held steady at the level it was when the power restoration phase was triggered. The power maintenance action continues while the timer operates and before the delay period has expired. At the expiration of the delay period the power increase action is invoked during which the power the load is allowed to consume is progressively increased. The rate of power increase is lower than the rate at which the power was diminished during the power compensation phase.

A second possibility is to factor the time delay in the rate of power increase. In such instance, the power restoration phase only has a power increase action, which starts at the same time the power restoration phase starts. In this example, the power to the load starts increasing immediately after the power restoration phase is initiated. The rate of power increase is determined such that full power to the load will be restored over a period of time that cannot be less than a threshold. The threshold can be anywhere from 2 seconds to 2 hours. Again, the rate of power increase is lower than the rate at which the power was diminished during the power compensation phase.

Note that in both scenarios above the threshold may not be static but it can be conditioned on to the severity of the frequency instability. As an example, the threshold is a function of the degree of frequency deviation during the frequency instability event; the larger the deviation the longer the threshold.

In the examples above, the overall duration of the power restoration phase exceeds the duration of the power compensation phase. The duration of the power compensation phase is defined between the moment the power to the load is reduced in response to a frequency instability event and the beginning of the power restoration phase. Thus, time wise the power compensation phase and the power restoration phase share a common boundary. The duration of the power restoration phase is defined between the moment the power restoration phase is triggered and the time the power to load is fully restored, thus at the completion of the power variation action.

Another possibility is to use a power restoration strategy that has a degree of randomness to it. In this case when a large number of households supplied by the grid and using independent power control devices 32 will increase their power consumption following a grid instability event, the increase will happen gradually without creating a load spike. For instance, the power restoration phase for an individual power control device 32 can be such that the load fully recovers at once, in other words there is no progressive load increase. The restoration time is not fixed but varies between boundaries, say 5 minutes to 3 hours. When the power restoration phase is initiated, the power control device 32 initiates the power maintenance action and randomly sets the time for transitioning to the power increase action within those boundaries. In this example, the power to the load will be switched up to its nominal value at once, anywhere from 5 minutes to 3 hours. In the population of the power control devices 32 in the entire power grid that manage the individual loads, this random selection is effected and would result in an overall recovery operation that is gradual and balanced out over the entire power restoration time window. Thus, from a power grid perspective, the load will increase progressively over the power restoration time window as individual power control devices 32 switch their loads back to nominal value.

Note that in the case of an individual power control device 32, the power to the load will increase at a rate that may not be lower than the rate of decrease during the power compensation phase. However, collectively, the rate of power increase will be lower since the individual power switch back events are spread over a time period that is longer than the period over which the power was reduced.

Another alternative is to provide the power control device 32 with an auto-learning ability to adapt the power regulation strategy based on past events, such as to fine tune the system response. For example, the power control device 32 can take into account usage data in connection with the load that is being controlled in order to adjust the power regulation strategy such as to reduce inconvenience to the end user as much as possible. For instance, the power control device 32 stores information about energy usage of the load over a period of time, say weeks or months, to determine patterns of heavier usage and patterns of lighter usage. If a power control is required, the strategy is conditioned on the basis of expected usage of the load during that period. For example, if the energy usage pattern indicates that the load is not being used or only lightly used during the night, then a frequency instability event occurring during the night will trigger a more aggressive load reduction susceptible to assist grid frequency stabilization and less likely to inconvenience the end user. In contrast, if the power restoration occurs during the day where the load usage is higher, then the load reduction response is less aggressive to reduce user inconvenience. By "less aggressive" is meant that the load will be reduced to a lesser degree and/or the load will be restored faster.

In another example, the power regulation strategy can be adapted on the basis of the real-time condition of a particular load. For example, if the load is a water heater and the water is at a low temperature (the spread between the actual water temperature and the set point is large), this water heater can acquire a "privileged" status such that the power regulation strategy will be less aggressive than a situation where the water is at or near the set point temperature. Specifically, the power control will reduce the load to a lesser degree and/or will recover the load faster. The same behavior can be considered with a heating system load where it may be desirable to reduce the power control in instances where a significant demand is placed on the heating system before the grid instability event occurred.

Figure 8:
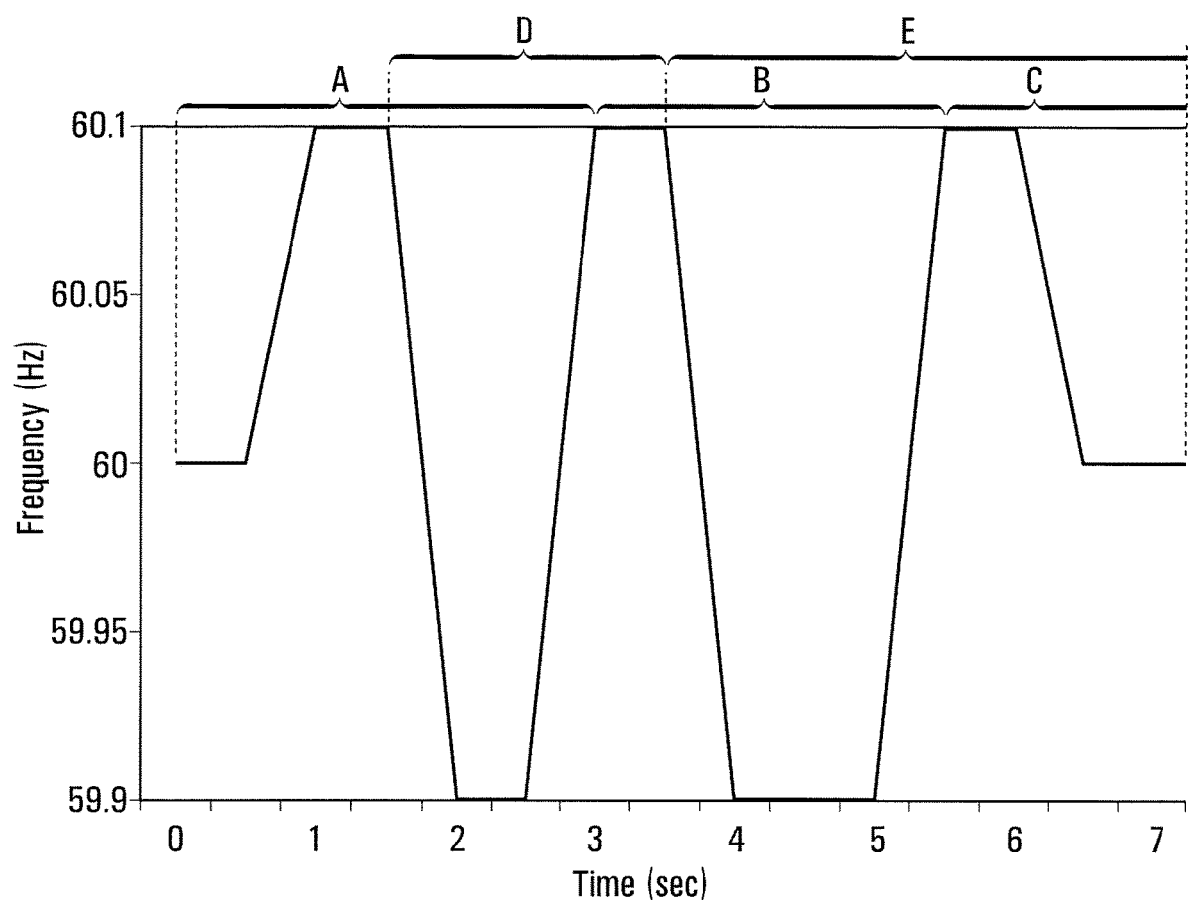
FIG. 8 is a graph that shows a frequency variation pattern to communicate messages to the power control device.

FIG. 8 illustrates a graph showing a frequency variation pattern that is impressed by the grid operator in the electrical grid and that can be used to communicate messages to the individual power control devices that continuously read the AC frequency.

The messages are frequency encoded which is accomplished by varying the frequency of the AC supply. The variations are small to avoid creating a frequency instability event. For example, the variations to perform the encoding can be kept at a percentage of the nominal or allowable frequency variation of the power grid. The percentage can be 25% for example. In a more specific example, in the case of an isolated power grid, the encoding can be done over a range of 0.2 Hz, preferably over a range of 0.15 Hz. In the case of an interconnected power grid a range of 0.05 Hz is appropriate.

In a specific example of implementation, the memory 44 stores representations of different frequency variation patterns that the power control device 32 should be able to recognize. Since the memory 44 stores a number of frequency measurements to compute an average value, the logic of the power control device 32 compares the patterns to the set of frequency data to determine if a pattern is being transmitted. Every time a new frequency measurement is stored in the memory 44, the content of the buffer with the frequency measurements is compared to the library of patterns the power control device 32 is designed to recognize. If a pattern is recognized then an action is taken.

Furthermore, patterns of frequency variation may vary in duration. For example, some patterns may be established within a period of 3 seconds (i.e.: from a time t=0 seconds to a time t=3 seconds), while others may be established within a period of less than 2 seconds (i.e.: from a time t=5 seconds to a time t=6 seconds). In addition, longer patterns taken over periods of more than 5 seconds can also be stored in the memory 44 for comparison. It is to be understood that a given set of data may be consulted (and compared) in multiple comparative trials in order to "fit" the data to possible patterns stored in memory 44. Thus, several comparative iterations may be necessary within a given period of time in order to associate the dynamically collected data to a pattern stored in memory 44. For example, shown in FIG. 8 are different sets of data A, B, C, D and E representing different portions of the graph from time t=0 seconds to t=7 seconds. Thus, at t=3 seconds, data set A may be compared to given patterns within memory 44. If no matches are found, then data sets B or C may be compared to patterns stored in memory 44. At the same time as the comparisons of data sets A, B or C occur, different combinations of data sets may also be compared in memory 44. For example, a data set comprising sets A and B (or alternatively B and C, or alternatively A and B and C) may be compared all the while comparing data sets D and E as they are collected. In addition, it is not necessary that data sets be connected in time. For example, a given pattern stored in memory 44 may comprise a time differential between different acquired data. For example, data sets A and C can correspond to a pattern wherein a corrective action may be associated with data sets A and C regardless of the data contained between A and C (i.e.: regardless of the data set B).

The action performed when a frequency variation pattern is recognized can be a command that directs the power control device 32 to do something. Examples of such commands will de provided below.

The frequency encoded messages me structured in different ways. One example is to design the system to operate on the basis of a limited number of messages, where each message is represented by an individually recognizable frequency variation pattern. The power control device 32 is designed to recognize the frequency variation patterns and implement the actions that are associated with the patterns. The action will likely be combined action and include a command associated with some parameter, such as a time parameter.

Alternatively, the message may have a structure allowing conveying multiple elements of information. This is a more flexible approach since it allows for more communication possibilities. In a specific example of implementation, the message includes a command portion that basically tells the power control devices what to do. In addition, the message also includes a time variable portion that conveys in addition to the command portion time information such as a delay or specific time at which the command is to be implemented and/or the duration for the action that the command entails. The message can be structured by frequency encoding symbols, such as individual bits. The power control device is designed to decode the message by decoding the individual symbols, assembling the message and then executing the command.

A possible message structure would include a header portion that is a frequency variation pattern that can be recognized by the individual power control devices 32 as a signal that a message is being sent. The header recognition is performed as discussed in connection with FIG. 8, where the frequency data is compared to a pattern stored in memory. Once a header is detected, the power control device 32 senses individual symbols. A particular symbol can be a specific frequency variation pattern occurring over a predetermined time period. For example, the system can be designed to transmit one symbol every second.

The logic of the power controller 32 assembles the symbols to determine the command that is to be executed.

The distinguish different message portions from one another a specific frequency variation pattern can be used, which when detected indicates to the logic of the power control device 32 the end a symbol stream and the beginning of a new one. In this fashion, the command portion of the message can be distinguished from the time variable portion.

To terminate the message, an end of message frequency variation pattern can be sent.

Figure 9:
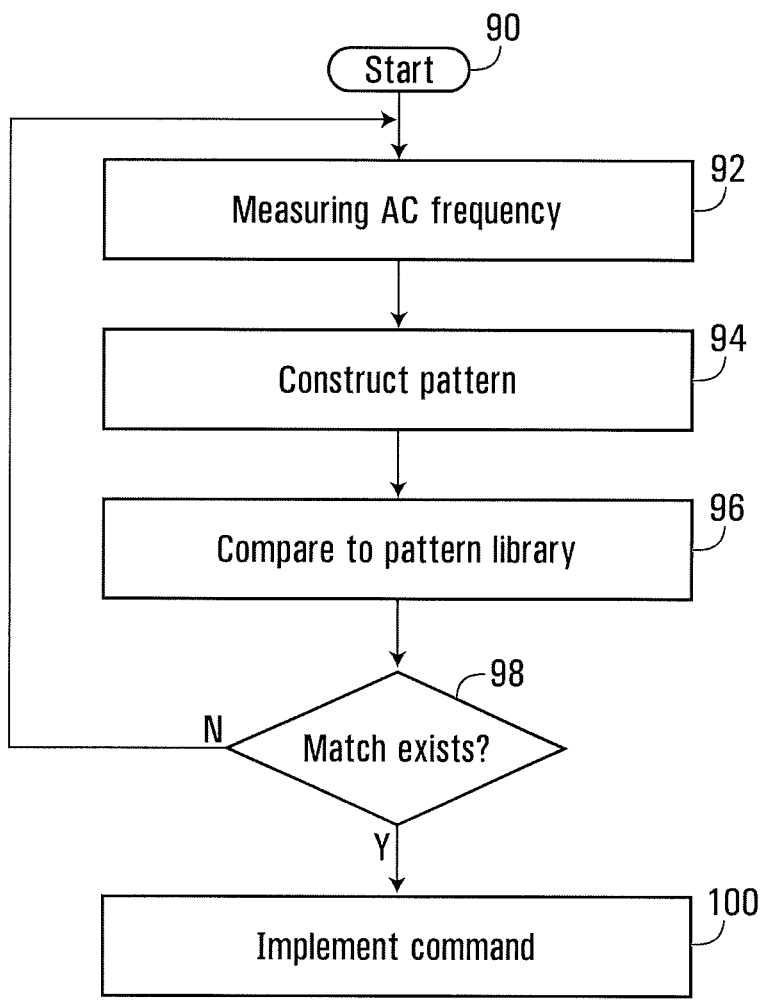
FIG. 9 is a flowchart of a process implemented by the power control device to decode messages encoded by frequency variation patterns.

FIG. 9, illustrates a flow chart outlining the steps implemented by the power control device 32 to decode and then execute frequency encoded messages. At step 92, the power control device 32 measures the AC frequency as discussed earlier. At step 94, a frequency variation pattern is constructed by mapping individual frequency values to time intervals. For example, the mapping would include associating a particular frequency value to a particular time period over which that frequency value was maintained.

The resulting frequency/time map is compared to a pattern stored in the memory of the power control device 32, at step 96. Assuming a match exists, as shown at step 98, the matching operation derives a command that is then executed. The command is implemented at step 100.

One example of a specific command that can be frequency encoded is to invoke the initial phase of the power regulation strategy, namely the power compensation phase. Such command allows the grid operator to determine the collective response of the population of power control devices 32 to a frequency instability event. That determination allows the operator to know the degree of load reduction capacity that is effectively available in the grid in the case a frequency instability event occurs.

The test involves the generation of the frequency encoded message. This is done by adjusting the frequency of the supply (when no frequency instability is present) to build the message which propagates over the entire grid and is received by each power control device 32. The message signals the power control devices to reduce the power the respective loads consume by a predetermined amount. The response of the power control devices 32 is determined by observing the state of loading of the grid. The timing and degree of load reduction is recorded and provides valuable information that can predict how the grid will react should a frequency instability event occur. The degree of loading on the grid can be determined by looking at the frequency variation that would occur as a result of the triggering of the power control devices 32. Since the effect is a load reduction, the resulting imbalance with the generation side will translate into a frequency increase. The degree of frequency increase is indicative of the degree of load reduction that is available.

As to the timing of the response, the frequency variation is mapped versus time to determine how the response, once triggered evolves time wise. The important parameter is deriving how fast the degree of loading of the grid is lessened.

Another example of a command is to inhibit the power control function for a predetermined time period. This command is useful to prevent the power control function to occur when the grid is being restored following a power outage.

Another example of a command is to trigger the power compensation phase preemptively when an overload on the grid is expected to occur or has occurred but frequency instability is not yet observable.

What is claimed is:

1. A method for providing autonomous frequency regulation services and remotely commanded frequency regulation services in an AC power grid which is characterized by a dynamic state of balance between power generation and consumption, wherein the AC power grid supplies an aggregate load made up of a multitude of individual loads which are geographically distributed over a territory serviced by the AC power grid, the method comprising:
   a. providing a power control device connected to an individual load of the aggregate load for managing the electrical consumption of the individual load, wherein the power control device, includes:
      i. a frequency sensing functional block for deriving frequency information from a power supply connection through which the AC power grid supplies the individual load with electrical energy and for deriving from the frequency information occurrence of an imbalance between power generation and consumption in the AC power grid and a magnitude of the imbalance;
      ii. an input for receiving a message issued by a remote entity directing the power control device to reduce the electrical consumption of the load;
      iii. an autonomous frequency regulation service logic functional block configured for, in response to detection of the imbalance, generating a first command for modulating the electrical energy consumption of the individual load in dependence of a magnitude of the imbalance;
      iv. a remotely commanded frequency regulation service functional block, responsive to the message from the remote entity to generate a second command for reducing the consumption of the load;
      v. power electronics module configured to control an RMS voltage impressed to the load to manage the electrical consumption of the load in response to the first and second commands;
   b. continuously deriving frequency information by the frequency sensing functional block;
   c. detecting by the frequency sensing functional block from the frequency information, occurrence of an imbalance between power generation and consumption and a magnitude of the imbalance;
   d. outputting by the autonomous frequency regulation service functional block the first command directing the power electronics module to reduce the RMS voltage impressed to the load to modulate the electrical consumption of the load linearly with relation to the magnitude of the imbalance;
   e. in response to the first command, reducing the RMS voltage applied to the load by the power electronics module;
   f. outputting by the remotely commanded frequency regulation service functional block the second command in response to the message from the remote entity, wherein the message is generated when the grid conditions indicate that an overload of the AC power grid is expected but the AC power grid is still in a condition of dynamic balance between power generation and consumption;
   g. in response to the second command, reducing the RMS voltage applied to the load by the power electronics module to reduce the consumption by the load by a predetermined amount.

2. The method of claim 1, wherein the autonomous frequency regulation service logic functional block compares an instantaneous value of the frequency of the AC power grid with a nominal value to determine the magnitude of the imbalance.

3. The method of claim 2, wherein the autonomous frequency regulation service logic functional block implements a deadband.

4. The method of claim 3, wherein the message from the remote entity is broadcasted over the AC power grid.

5. The method of claim 4, wherein the message is frequency encoded by varying a frequency of the AC power grid.

6. The method of claim 5, including varying the frequency without exceeding a boundary of the deadband.

7. The method of claim 1, wherein the message has a command portion.

8. The method of claim 7, wherein the message has a time portion.

9. The method of claim 8, wherein the time portion indicates a time at which the command conveyed by the command portion is to be executed.

10. The method of claim 8, wherein the time portion indicates a duration of the command.

* * * * *

UNITED STATES PATENT AND TRADEMARK OFFICE
CERTIFICATE OF CORRECTION

PATENT NO. : 10,742,029 B2  
APPLICATION NO. : 15/385474  
DATED : August 11, 2020  
INVENTOR(S) : Gilles Trudel et al.

Page 1 of 1

It is certified that error appears in the above-identified patent and that said Letters Patent is hereby corrected as shown below:

On the Title Page

Item (60), first line under "Related U.S. Application Data," delete "Provisional" and insert --Continuation of--.

Signed and Sealed this  
Sixth Day of October, 2020

Andrei Iancu  
*Director of the United States Patent and Trademark Office*